(12) United States Patent
Gu et al.

(10) Patent No.: US 11,164,895 B2
(45) Date of Patent: Nov. 2, 2021

(54) ARRAY SUBSTRATE, METHOD FOR MANUFACTURING THE SAME, DISPLAY PANEL AND DISPLAY DEVICE

(71) Applicants: BOE TECHNOLOGY GROUP CO., LTD., Beijing (CN); Hefei Xinsheng Optoelectronics Technology Co., Ltd., Anhui (CN)

(72) Inventors: Xiaofang Gu, Beijing (CN); Xiaoye Ma, Beijing (CN); Xiping Wang, Beijing (CN)

(73) Assignees: BOE Technology Group Co., Ltd., Beijing (CN); Hefei Xinsheng Optoelectronics Technology Co., Ltd., Hefei (CN)

( * ) Notice: Subject to any disclaimer, the term of this patent is extended or adjusted under 35 U.S.C. 154(b) by 568 days.

(21) Appl. No.: 16/066,660

(22) PCT Filed: Oct. 19, 2017

(86) PCT No.: PCT/CN2017/106860
§ 371 (c)(1),
(2) Date: Jun. 27, 2018

(87) PCT Pub. No.: WO2018/188299
PCT Pub. Date: Oct. 18, 2018

(65) Prior Publication Data
US 2021/0013231 A1    Jan. 14, 2021

(30) Foreign Application Priority Data
Apr. 14, 2017  (CN) .......................... 201710244489.0

(51) Int. Cl.
*H01L 27/12*   (2006.01)
*H01L 23/60*   (2006.01)
*H01L 27/02*   (2006.01)

(52) U.S. Cl.
CPC ............ *H01L 27/124* (2013.01); *H01L 23/60* (2013.01); *H01L 27/0248* (2013.01); *H01L 27/1259* (2013.01)

(58) Field of Classification Search
CPC .................... H01L 27/124–1244; H01L 23/60
See application file for complete search history.

(56) References Cited

U.S. PATENT DOCUMENTS 6,943,374 B1 *   9/2005  Park .................... G02F 1/1309
                                              257/72
2017/0271368 A1 * 9/2017 Zhang ................ H01L 27/1259

FOREIGN PATENT DOCUMENTS

CN        101546076 A  *  9/2009
CN        103513459 A     1/2014
                        (Continued)

OTHER PUBLICATIONS

English Translation for 101546076 provided. Translation on Mar. 17, 2021.*
(Continued)

*Primary Examiner* — Amar Movva
(74) *Attorney, Agent, or Firm* — Arch & Lake LLP

(57) ABSTRACT

The present disclosure relates to an array substrate, a method for manufacturing the same, a display panel, and a display device. The array substrate includes: a gate metal layer, disposed on the substrate and the gate metal layer including a grounding wire located in the peripheral region; a gate insulating layer, at least covering the gate metal layer; and a conductive layer structure, disposed over the gate insulating layer and including an auxiliary grounding wire located in the peripheral region, wherein the auxiliary grounding wire is connected to the grounding wire. The present disclosure can prevent ESD more effectively.

7 Claims, 3 Drawing Sheets

(56) References Cited

FOREIGN PATENT DOCUMENTS

| CN | 104965368 | A | | 10/2015 | | |
|---|---|---|---|---|---|---|
| CN | 105070712 | A | | 11/2015 | | |
| CN | 105575961 | A | * | 5/2016 | ........... | H01L 27/124 |
| CN | 106997877 | A | | 8/2017 | | |

OTHER PUBLICATIONS

International Search Report and Written Opinion for PCT/CN2017/106860 dated Jan. 30, 2018.

* cited by examiner

ARRAY SUBSTRATE, METHOD FOR MANUFACTURING THE SAME, DISPLAY PANEL AND DISPLAY DEVICE

CROSS REFERENCE

The present application is based on International Application No. PCT/CN2017/106860, filed on Oct. 19, 2017, which is based upon and claims priority to Chinese Patent Application No. 201710244489.0, filed on Apr. 14, 2017, and titled "array substrate, method for manufacturing the same, display panel, and display device", and the entire contents thereof are incorporated herein by reference.

TECHNICAL FIELD

The present disclosure relates to the field of display technology, and in particular, to an array substrate, a method for manufacturing the same, a display panel, and a display device.

BACKGROUND

With the development of the information society, users' demands for display devices are getting higher and higher, which led to the in-depth study of display technologies. Moreover, the appearance of the display device is getting more and more attention. A narrow bezel has almost pervaded the entire display field as a design trend. As for the panel of the same size, a display area of the screen of a narrow bezel product is larger, which allows the user to obtain better visual effects, and the appearance of the product is more beautiful and fashionable. In addition, when the display device requires dual-screen splicing, a narrow bezel can achieve a better splicing effect.

During the test and use of the display device, static electricity can cause many adverse effects (e.g., unstable display screen, display panel failure, etc.). Therefore, design to prevent ESD (Electrostatic Discharge) is important. For a liquid crystal display device, forming a grounding wire by arranging a gate metal layer in the peripheral region of the substrate, can prevent the occurrence of ESD. However, the design of the narrow bezel can cause a small width of the peripheral region of the substrate, which results in a small width and a large resistance of the grounding wire, and the static electricity cannot be timely and effectively removed, which can affect performance of internal components of the display device.

In view of this, there is a need for a novel array substrate, a method for manufacturing the same, a display panel, and a display device.

It should be noted that the information disclosed in the foregoing background section is only for enhancement of understanding of the background of the present disclosure and therefore can include information that does not constitute prior art that is already known to those of ordinary skill in the art.

SUMMARY

According to one aspect of the present disclosure, there is provided an array substrate, including a display region and a peripheral region surrounding the display region. The array substrate includes:

a gate metal layer, disposed on the substrate and the gate metal layer and including a grounding wire located in the peripheral region;

a gate insulating layer, at least covering the gate metal layer; and a conductive layer structure, disposed over the gate insulating layer and including an auxiliary grounding wire located in the peripheral region. The auxiliary grounding wire is connected to the grounding wire.

In an exemplary arrangement of the present disclosure, the conductive layer structure includes a source-drain metal layer and the auxiliary grounding wire includes a first auxiliary grounding wire located in the source-drain metal layer.

In an exemplary arrangement of the present disclosure, the first auxiliary grounding wire is located above the grounding wire.

In an exemplary arrangement of the present disclosure, the array substrate further includes:

a passivation layer, at least covering the source-drain metal layer.

In an exemplary arrangement of the present disclosure, the conductive layer structure includes a transparent electrode layer and the auxiliary grounding wire includes a second auxiliary grounding wire in the transparent electrode layer.

In an exemplary arrangement of the present disclosure, a width of the second auxiliary grounding wire is greater than that of the grounding wire.

In an exemplary arrangement of the present disclosure, the conductive layer structure includes a transparent electrode layer and the auxiliary grounding wire includes a second auxiliary grounding wire in the transparent electrode layer.

In an exemplary arrangement of the present disclosure, a width of the second auxiliary grounding wire is greater than that of the grounding wire.

In an exemplary arrangement of the present disclosure, the array substrate further includes:

an electrostatic ring, electrically connected to at least one of the grounding wire, the first auxiliary grounding wire, and the second auxiliary grounding wire.

According to one aspect of the present disclosure, there is provided a display panel. The display panel includes any one of the array substrates described above.

According to one aspect of the present disclosure, there is provided a display device. The display device includes any one of the display panels described above.

According to one aspect of the present disclosure, there is provided method for manufacturing an array substrate. The array substrate includes a display region and a peripheral region surrounding the display region. The array substrate manufacturing method includes:

forming a gate metal layer on the substrate, the gate metal layer including a grounding wire in the peripheral region;

forming a gate insulating layer at least covering the gate metal layer; and forming a conductive layer structure over the gate insulating layer, the conductive layer structure including an auxiliary grounding wire in the peripheral region. The auxiliary grounding wire is connected to the grounding wire.

In an exemplary arrangement of the present disclosure, the conductive layer structure includes a source-drain metal layer and the auxiliary grounding wire includes a first auxiliary grounding wire located in the source-drain metal layer.

In an exemplary arrangement of the present disclosure, the conductive layer structure includes a transparent electrode layer and the auxiliary grounding wire includes a second auxiliary grounding wire located in the transparent electrode layer.

It is to be understood that both the foregoing general description and the following detailed description are exemplary and explanatory only and are not restrictive of the present disclosure.

BRIEF DESCRIPTION OF THE DRAWINGS

The accompanying drawings herein are incorporated in and constitute a part of this specification, illustrate arrangements consistent with the present disclosure, and together with the description serve to explain the principles of the disclosure. Obviously, the drawings in the following description are merely some arrangements of the present disclosure, and those skilled in the art can also obtain other drawings based on these drawings without any creative work. In the drawing.

DETAILED DESCRIPTION

Figure 1:
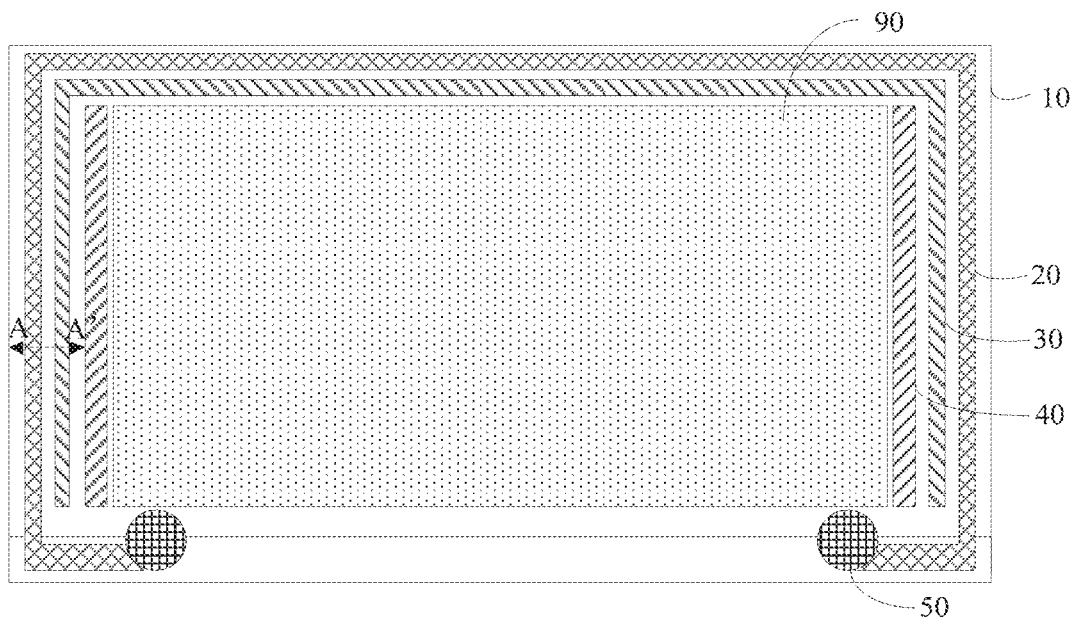
FIG. 1 schematically shows a front view of an array substrate for preventing ESD.

Example arrangements are described more fully with reference to the accompanying drawings. However, the example arrangements can be embodied in many forms and should not be construed as limited to the arrangements set forth herein; rather, these arrangements are provided so that this disclosure is more complete and complete, and fully conveys the concept of the example arrangements to those skilled in the art. The features, structures, or characteristics described herein can be combined in any suitable manner in one or more arrangements. In the following description, numerous specific details are given to provide a thorough understanding of arrangements of the present disclosure. However, those skilled in the art can recognize that the technical solutions of the present disclosure can be practiced without one or more of the specific details, or can adopt other methods, components, devices, steps and the like. In other instances, well-known technical solutions are not shown or described in detail to avoid distracting and obscuring aspects of the present disclosure.

Moreover, the drawings are merely schematic illustrations of the present disclosure and are not necessarily drawn to scale. The same reference numerals in the drawings denote the same or similar parts, and their repeated description is omitted. In addition, the term "above" as used in the present disclosure means that a structure is formed "directly" on other structures, or means that a structure is "indirectly" disposed on other structures through another structure.

The flowcharts shown in the drawings are merely illustrative and do not necessarily include all the steps. For example, some steps can be decomposed and some steps can be merged or partially merged. Therefore, the order of actual execution can be changed according to actual conditions.

FIG. 1 schematically shows a front view of an array substrate for preventing ESD. Referring to FIG. 1, the array substrate can include a display region 90 and a peripheral region surrounding the display region 90. Further, the peripheral region can include a substrate 10, a grounding wire 20 disposed on the substrate 10, a common electrode wire 30, and a GOA (Gate Driver on Array) unit 40. In addition, the peripheral region can further include a silver glue region 50 and other structures. The silver glue region 50 can be used to establish electrical connection with the conductive film of a color film substrate. The generated static electricity can be removed through the grounding wire 20 provided in the surrounding region, to prevent the static electricity from affecting various components on the array substrate.

Figure 2:
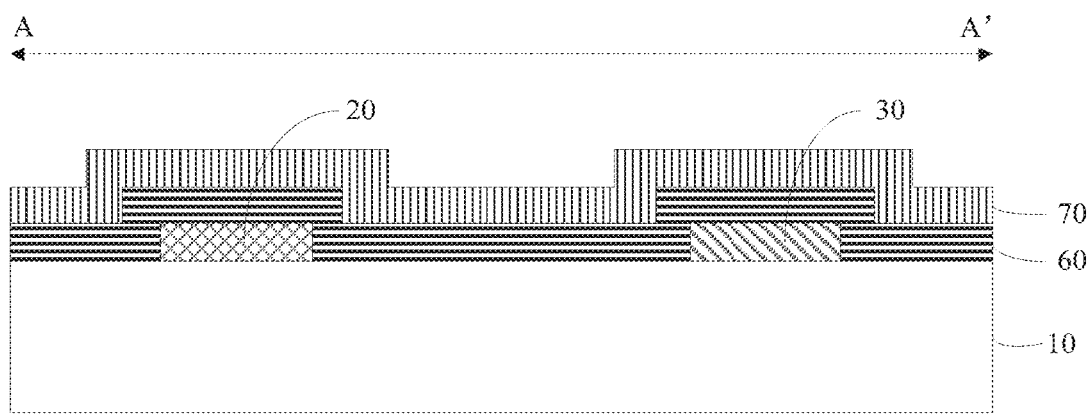
FIG. 2 schematically shows a cross-sectional view of a portion of the array substrate of FIG. 1 taken along a dashed line AA'.

FIG. 2 schematically shows a cross-sectional view of a portion of the array substrate of FIG. 1 taken along a dashed line AA'. Referring to FIG. 2, a grounding wire 20, a common electrode wire 30, a gate insulating layer 60 covering the grounding wire 20 and the common electrode wire 30 and a passivation layer covering the gate insulating layer 60 can be provided on the substrate 10.

However, as for a display device with a narrow bezel design, a width of the peripheral region surrounding the display region is generally small, which results in a small width and a large resistance of the grounding wire, and the inability to conduct static electricity in a timely and effective manner, which can possibly result in abnormal display.

In view of this, exemplary arrangements of the present disclosure provide a novel array substrate. The array substrate can include:

a gate metal layer, disposed on the substrate and the gate metal layer and including a grounding wire located in the peripheral region;

a gate insulating layer, at least covering the gate metal layer; and a conductive layer structure, disposed over the gate insulating layer and including an auxiliary grounding wire located in the peripheral region.

In an exemplary arrangement of the present disclosure, a structure of at least two layers of grounding wires can be constituted by configuring the auxiliary grounding wire and in combination with the grounding wire of the gate metal layer, which reduces a resistance of the grounding wire used to guide static electricity and is useful in preventing ESD.

A first arrangement of the present disclosure will be described below with reference to FIG. 3. In the first arrangement of the present disclosure, the conductive layer structure can be an SD metal layer (i.e., a source-drain metal layer), and the auxiliary grounding wire can be the first auxiliary grounding wire located in the SD metal layer.

Figure 3:
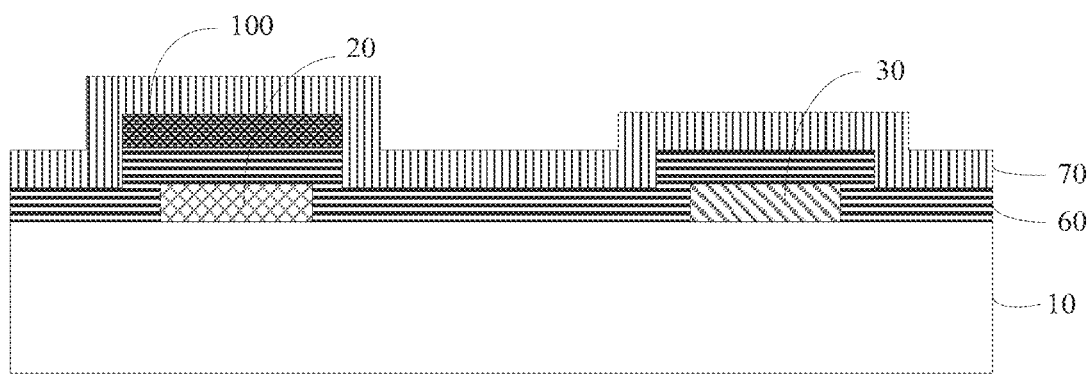
FIG. 3 schematically shows a cross-sectional view of a first arrangement of a portion of an array substrate corresponding to a position of a dashed line AA' according to an exemplary arrangement of the present disclosure.

Referring to FIG. 3, the substrate 10 can be a glass substrate. However, the substrate 10 can also be a quartz substrate or a transparent plastic substrate for flexible display. Although the present disclosure takes the glass substrate as an example, substrates using other materials should also belong to the scope of the present disclosure.

A gate metal layer (not shown) can be disposed on the substrate 10. The gate metal layer can include a grounding wire 20 located in a peripheral region, and the grounding wire 20 can be a single-layer grounding wire composed of molybdenum (Mo), a molybdenum-niobium (MoNb) alloy, aluminum (Al), an aluminum-neodymium (AlNd) alloy, titanium (Ti), or cuprum (Cu). Alternatively, the grounding wire 20 can also be a composite laminated layer made of a variety of materials among molybdenum (Mo), a molybdenum-niobium (MoNb) alloy, aluminum (Al), an aluminum-neodymium (AlNd) alloy, titanium (Ti), or cuprum (Cu). Preferably, the grounding wire 20 can be a single-layered grounding wire formed of Mo, Al, or an alloy containing Mo or Al, or the grounding wire 20 can be a composite laminated layer formed of a plurality of materials among Mo, Al, an alloy containing Mo or Al.

Similarly, a common electrode wire 30 can be further disposed on the substrate 10. The common electrode wire 30 can be disposed parallel to the grounding wire 20, and the material of the common electrode wire 30 can be the same as the that of the grounding wire 20, which will not be described herein.

A gate insulating layer 60 can also be disposed on the substrate 10, and the gate insulating layer 60 can at least cover the gate metal layer. The gate insulating layer 60 can be a single insulating layer made of silicon oxide (SiOx), silicon nitride (SiNx), hafnium oxide (HfOx), or the like. In addition, the gate insulating layer 60 can also be a composite laminated layer formed by at least two materials among the silicon oxide (SiOx), silicon nitride (SiNx), and hafnium oxide (HfOx). Preferably, the gate insulating layer 60 can be a single insulating layer formed of SiOx.

A conductive layer structure can be provided on the gate insulating layer 60, and the conductive layer structure can include an auxiliary grounding wire located in the peripheral region. In the present arrangement, the conductive layer structure can be an SD metal layer, and the auxiliary grounding wire can be the first auxiliary grounding wire 100 located in the SD metal layer. The material of the SD metal layer can be the same as that of the grounding wire 20 described above, and will not be described here. However, the material of the SD metal layer can also be different from that of the grounding wire 20.

In addition, in the present example arrangement, the first auxiliary grounding wire 100 can be located directly above the grounding wire 20, that is, an orthographic projection of the auxiliary grounding line 100 on the substrate covers an orthographic projection of the grounding line 20 on the substrate. However, in the peripheral region, the first auxiliary grounding wire 100 can be disposed at any other position on the gate insulating layer 60. Besides, the width of the first auxiliary grounding wire 100 is also not limited to the relative width illustrated in FIG. 3. The width of the first auxiliary grounding wire 100 can be much wider than that of the grounding wire 20.

In addition, one end of the first auxiliary grounding wire 100 and one end of the grounding wire 20 can be connected to a silver glue region (e.g., the silver glue region 50 shown in FIG. 1). Thus, combining the first auxiliary grounding wire 100 with the grounding wire 20 corresponds to connecting the grounding wire 20 in parallel with another grounding wire. As a whole, the wider the width of the first auxiliary grounding wire 100 is, the smaller the resistance is, which is useful in preventing ESD.

The array substrate of the first arrangement of the present disclosure can further include a passivation layer 70 that at least covers the SD metal layer. The material of the passivation layer 70 can be the same as that of the gate insulating layer 60. However, the material of the passivation layer 70 can be aluminum oxide (AlOx), or the passivation layer 70 can be made of an acrylic material or an organic material such as a resin, which is not particularly limited in this exemplary arrangement.

In the first arrangement of the present disclosure, by configuring the first auxiliary grounding wire 100, the resistance of the grounding wire for guiding static electricity is reduced, which is useful in preventing ESD.

A second arrangement of the present disclosure will be described with reference to FIG. 4. In the second arrangement of the present disclosure, the conductive layer structure can be a transparent electrode layer, and the transparent electrode layer can be, for example, an ITO (Indium Tin Oxide) layer. In addition, the auxiliary grounding wire can be a second auxiliary grounding wire located in the transparent electrode layer.

Figure 4:
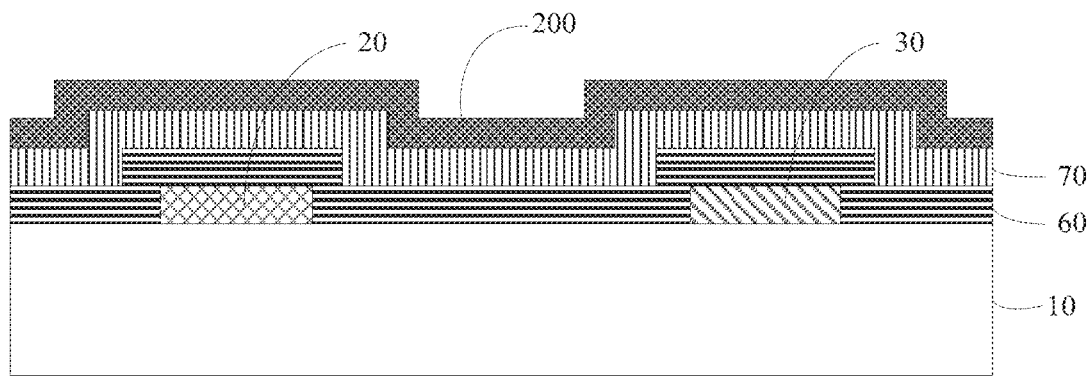
FIG. 4 schematically shows a cross-sectional view of a second arrangement of a portion of an array substrate corresponding to a position of a dashed line AA' according to an exemplary arrangement of the present disclosure.

The substrate 10, the grounding wire 20, the common electrode wire 30, and the gate insulating layer 60 in FIG. 4 can be the same as the substrate 10, the grounding wire 20, the common electrode wire 30, and the gate insulating layer 60 shown in FIG. 3 in the first arrangement of the present disclosure, which will not be described herein.

Referring to FIG. 4, a passivation layer 70 can be disposed on the gate insulating layer 60. The material of the passivation layer 70 can be the same as the passivation layer 70 illustrated in FIG. 3 in the first arrangement, and will not be described herein.

In the second arrangement of the present disclosure, a conductive layer structure can be provided on the passivation layer 70, and the conductive layer structure can include an auxiliary grounding wire located in the peripheral region. In this arrangement, the conductive layer structure can be a transparent electrode layer. Specifically, the transparent electrode layer can be, for example, an ITO layer, and the auxiliary grounding wire can be the second auxiliary grounding wire 200 located in the transparent electrode layer.

The width of the second auxiliary grounding wire 200 can be greater than that of the grounding wire 20. For example, in FIG. 4, the second auxiliary grounding wire 200 can cover the entire region corresponding to the dotted line AA'. However, the width of the second auxiliary grounding wire 200 is not limited to this.

In addition, one end of the second auxiliary grounding wire 200 and one end of the grounding wire 20 can be connected to a silver glue region (e.g., the silver glue region 50 shown in FIG. 1). Thus, combining the second auxiliary grounding wire 200 with the grounding wire 20 corresponds to connecting the grounding wire 20 in parallel with another grounding wire. As a whole, the wider the width of the second auxiliary grounding wire 200 is, the smaller the resistance is, which is useful in preventing ESD.

In addition, in the second arrangement of the present disclosure, the array substrate can further include an electrostatic ring (not shown), which can be electrically connected to at least one of the grounding wire 20 and the second auxiliary grounding wire 200.

In the second arrangement of the present disclosure, by configuring the second auxiliary grounding wire 200, the resistance of the grounding wire for guiding the static electricity is reduced, which helps to prevent ESD. Meanwhile, the ability of preventing ESD is further enhanced by configuring the electrostatic ring.

A third arrangement of the present disclosure will be described with reference to FIG. 5. In the third arrangement of the present disclosure, the conductive layer structure can include an SD metal layer and a transparent electrode layer. In addition, the auxiliary grounding wire can include a first auxiliary grounding wire located on the SD metal layer and a second auxiliary grounding wire located on the transparent electrode layer, respectively.

Figure 5:
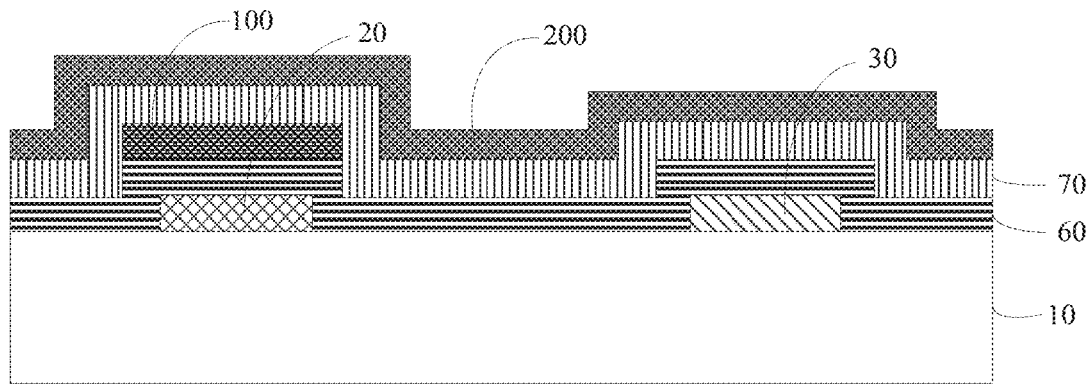
FIG. 5 schematically shows a cross-sectional view of a third arrangement of a portion of an array substrate corresponding to a position of a dashed line AA' according to an exemplary arrangement of the present disclosure.

The substrate 10, the grounding wire 20, the common electrode wire 30, the gate insulating layer 60, the first auxiliary grounding wire 100, and the passivation layer 70 in FIG. 5 can be the same as the substrate 10, the grounding wire 20, the common electrode wire 30, the gate insulating layer 60, the first auxiliary grounding wire 100, and the passivation layer 70 shown in FIG. 3 in the first arrangement of the present disclosure and will not be described herein.

Referring to FIG. 5, a transparent electrode layer can be disposed on the passivation layer 70, and the transparent electrode layer can include a second auxiliary grounding wire 200 located in a peripheral region. Similar to the second arrangement of the present disclosure shown in FIG. 4, the width of the second auxiliary grounding wire 200 can be greater than that of the grounding wire 20.

In addition, one end of the grounding wire 20, one end of the first auxiliary grounding wire 100 and one end of the second auxiliary grounding wire 200 can be connected to a silver glue region (e.g., the silver glue region 50 shown in FIG. 1). Thus, combining the grounding wire 20 and the first auxiliary grounding wire 100 with the second auxiliary grounding wire corresponds to that the grounding wire 20, the first auxiliary grounding wire 100, and the second auxiliary grounding wire 200 constitute a three-layer structure guiding the static electricity. Such a structure, as a whole, greatly reduces the conduction resistance and can prevent ESD more effectively.

In addition, in the third arrangement of the present disclosure, the array substrate can further include an electrostatic ring (not shown), which can be electrically connected to at least one of the grounding wire 20, the first auxiliary grounding wire 100 and the second auxiliary grounding wire 200.

In the third arrangement of the present disclosure, by configuring the first auxiliary grounding wire 100 and the second auxiliary grounding wire 200, the resistance of the grounding wire for guiding the static electricity is greatly reduced, which helps to prevent ESD. Meanwhile, the ability of preventing ESD is further enhanced by configuring the electrostatic ring.

Figure 6:
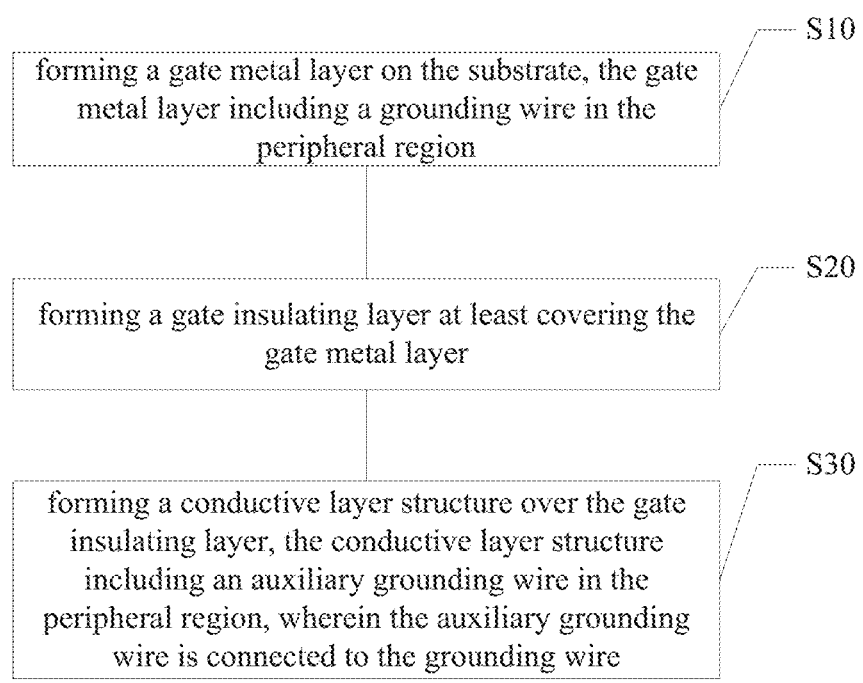
FIG. 6 schematically shows a flowchart of a method for manufacturing an array substrate according to an exemplary arrangement of the present disclosure.

Further, an exemplary arrangement also provides a method for manufacturing an array substrate. Specifically, referring to FIG. 6, a method for manufacturing an array substrate can include:

S10, forming a gate metal layer on the substrate, the gate metal layer including a grounding wire in the peripheral region;

S20, forming a gate insulating layer at least covering the gate metal layer; and S30, forming a conductive layer structure over the gate insulating layer, the conductive layer structure including an auxiliary grounding wire in the peripheral region.

According to an exemplary arrangement of the present disclosure, the conductive layer structure includes a source-drain metal layer and the auxiliary grounding wire includes a first auxiliary grounding wire located in the source-drain metal layer.

According to an exemplary arrangement of the present disclosure, the conductive layer structure includes a transparent electrode layer and the auxiliary grounding wire includes a second auxiliary grounding wire located in the transparent electrode layer.

Specifically, in an exemplary arrangement of the present disclosure, a gate metal layer can be formed on a substrate through sputter deposition, and a grounding wire can be formed through a patterning process. In addition, a gate insulating layer at least covering the gate metal layer can be formed by plasma enhanced chemical vapor deposition (PECVD). In addition, a conductive layer structure can be formed over the gate insulating layer by using a sputter deposition manner, and an auxiliary grounding wire can be formed through a patterning process. However, those skilled in the art can easily conceive that other manufacturing processes can also be used to manufacture the array substrate of the present disclosure. For example, the method for forming the gate metal layer can also include thermal evaporation. The method for forming a conductive layer structure can also include PECVD or the like.

It should be noted that although various steps of the method in the present disclosure are described in the drawings in a specific order, this does not require or imply that these steps must be performed in this particular order, or that all illustrated steps must be performed to achieve the desired result. Additionally, or alternatively, some steps can be omitted, a plurality of steps can be combined into one step, and/or one step can be divided into a plurality of steps for execution, or the like.

Further, a display panel is also provided in the present exemplary arrangement. The display panel includes the above-described array substrate.

Further, the present exemplary arrangement also provides a display device, which may include the above-described display panel. The display device can specifically be a product or component having any display function, such as a mobile phone, a tablet computer, a television set, a display, a notebook computer, a digital photo frame, a navigator, and the like.

The array substrate, the display panel, and the display device provided by the present disclosure can prevent ESD more effectively.

Those skilled in the art will readily recognize other arrangements of the present disclosure upon consideration of the specification and practice of the disclosure disclosed herein. This application is intended to cover any variations, uses, or adaptations of the present disclosure which follow the general principles of the present disclosure and include any common knowledge or conventional techniques in this technical field not disclosed by the present disclosure. The description and arrangements are to be considered exemplary only, with the true scope and spirit of the present disclosure being indicated by the appended claims.

It should be understood that the present disclosure is not limited to the precise structure that has been described above and shown in the drawings, and various modifications and changes can be made without departing from the scope thereof. The scope of the present disclosure is limited only by the appended claims.

What is claimed is:

1. An array substrate, comprising a display region and a peripheral region surrounding the display region, wherein the array substrate comprises:
   a substrate;
   a gate metal layer, disposed on the substrate and the gate metal layer comprising a grounding wire located in the peripheral region;
   a common electrode wire parallel to the grounding wire;
   a gate insulating layer, at least covering the gate metal layer; and
   a conductive layer structure, disposed over the gate insulating layer and the conductive layer structure comprising an auxiliary grounding wire located in the peripheral region, wherein the auxiliary grounding wire is connected to the grounding wire, the conductive layer structure comprises a source-drain metal layer and the auxiliary grounding wire comprises a first auxiliary grounding wire located in the source-drain metal layer, an orthographic projection of the first auxiliary grounding line on the substrate covers an orthographic projection of the grounding line on the substrate, and one end of the first auxiliary grounding wire and one end of the grounding wire are connected to a silver glue region, and the silver glue region establishes electrical connection with a conductive film of a color film substrate;

wherein the array substrate further comprises a passivation layer, at least covering the source-drain metal layer, the conductive layer structure further comprises a transparent electrode layer on the passivation layer and the auxiliary grounding wire comprises a second auxiliary grounding wire located in the transparent electrode layer, one end of the grounding wire, one end of the first auxiliary grounding wire and one end of the second auxiliary grounding wire are connected to the silver glue region, the first auxiliary grounding wire is connected in parallel with the connecting the grounding wire, the second auxiliary grounding wire is connected in parallel with the connecting the grounding wire, the first auxiliary grounding wire, and the second auxiliary grounding wire constitute a three-layer structure guiding static electricity, and the second auxiliary grounding wire covers the common electrode wire and the grounding line.

2. The array substrate according to claim 1, wherein a width of the second auxiliary grounding wire is greater than a width of the grounding wire.

3. The array substrate according to claim 1, wherein the array substrate further comprises:
an electrostatic ring, electrically connected to at least one of the grounding wire, the first auxiliary grounding wire, and the second auxiliary grounding wire.

4. A display panel, comprising:
an array substrate, wherein the array substrate comprises a display region and a peripheral region surrounding the display region, wherein the array substrate comprises:
a substrate;
a gate metal layer, disposed on the substrate and the gate metal layer comprising a grounding wire located in the peripheral region;
a common electrode wire parallel to the grounding wire;
a gate insulating layer, at least covering the gate metal layer; and
a conductive layer structure, disposed over the gate insulating layer and the conductive layer structure comprising an auxiliary grounding wire located in the peripheral region, wherein the auxiliary grounding wire is connected to the grounding wire, the conductive layer structure comprises a source-drain metal layer and the auxiliary grounding wire comprises a first auxiliary grounding wire located in the source-drain metal layer, an orthographic projection of the first auxiliary grounding line on the substrate covers an orthographic projection of the grounding line on the substrate, and one end of the first auxiliary grounding wire and one end of the grounding wire are connected to a silver glue region, and the silver glue region establishes electrical connection with a conductive film of a color film substrate;

wherein the array substrate further comprises a passivation layer, at least covering the source-drain metal layer, the conductive layer structure further comprises a transparent electrode layer on the passivation layer and the auxiliary grounding wire comprises a second auxiliary grounding wire located in the transparent electrode layer, one end of the grounding wire, one end of the first auxiliary grounding wire and one end of the second auxiliary grounding wire are connected to the silver glue region, the first auxiliary grounding wire is connected in parallel with the connecting the grounding wire, the second auxiliary grounding wire is connected in parallel with the connecting the grounding wire, the first auxiliary grounding wire, and the second auxiliary grounding wire constitute a three-layer structure guiding static electricity, and the second auxiliary grounding wire covers the common electrode wire and the grounding line.

5. The display panel according to claim 4, wherein a width of the second auxiliary grounding wire is greater than that of the grounding wire.

6. A display device, comprising:
a display panel, the display panel comprising:
an array substrate, wherein the array substrate comprises a display region and a peripheral region surrounding the display region, wherein the array substrate comprises:
a substrate;
a gate metal layer, disposed on the substrate and the gate metal layer comprising a grounding wire located in the peripheral region;
a common electrode wire parallel to the grounding wire;
a gate insulating layer, at least covering the gate metal layer; and
a conductive layer structure, disposed over the gate insulating layer and the conductive layer structure comprising an auxiliary grounding wire located in the peripheral region, wherein the auxiliary grounding wire is connected to the grounding wire, the conductive layer structure comprises a source-drain metal layer and the auxiliary grounding wire comprises a first auxiliary grounding wire located in the source-drain metal layer, an orthographic projection of the first auxiliary grounding line on the substrate covers an orthographic projection of the grounding line on the substrate, and one end of the first auxiliary grounding wire and one end of the grounding wire are connected to a silver glue region, and the silver glue region establishes electrical connection with a conductive film of a color film substrate;

wherein the array substrate further comprises a passivation layer, at least covering the source-drain metal layer, the conductive layer structure further comprises a transparent electrode layer on the passivation layer and the auxiliary grounding wire comprises a second auxiliary grounding wire located in the transparent electrode layer, one end of the grounding wire, one end of the first auxiliary grounding wire and one end of the second auxiliary grounding wire are connected to the silver glue region, the first auxiliary grounding wire is connected in parallel with the connecting the grounding wire, the second auxiliary grounding wire is connected in parallel with the connecting the grounding wire, the first auxiliary grounding wire, and the second auxiliary grounding wire constitute a three-layer structure guiding static electricity, and the second auxiliary grounding wire covers the common electrode wire and the grounding line.

7. A method for manufacturing an array substrate, wherein the array substrate comprises a display region and a peripheral region surrounding the display region, wherein the array substrate manufacturing method comprises:

forming a gate metal layer on the substrate, the gate metal layer comprising a grounding wire in the peripheral region;

forming a common electrode wire parallel to the grounding wire;

forming a gate insulating layer at least covering the gate metal layer; and forming a conductive layer structure over the gate insulating layer, the conductive layer structure comprising an auxiliary grounding wire in the peripheral region, wherein the auxiliary grounding wire is connected to the grounding wire, the conductive layer structure comprises a source-drain metal layer and the auxiliary grounding wire comprises a first auxiliary grounding wire located in the source-drain metal layer, an orthographic projection of the first auxiliary grounding line on the substrate covers an orthographic projection of the grounding line on the substrate, and one end of the first auxiliary grounding wire and one end of the grounding wire are connected to a silver glue region, and the silver glue region establishes electrical connection with a conductive film of a color film substrate, the array substrate further comprises a passivation layer, at least covering the source-drain metal layer, the conductive layer structure further comprises a transparent electrode layer on the passivation layer and the auxiliary grounding wire comprises a second auxiliary grounding wire located in the transparent electrode layer, one end of the grounding wire, one end of the first auxiliary grounding wire and one end of the second auxiliary grounding wire are connected to the silver glue region, the first auxiliary grounding wire is connected in parallel with the connecting the grounding wire, the second auxiliary grounding wire is connected in parallel with the connecting the grounding wire, the first auxiliary grounding wire, and the second auxiliary grounding wire constitute a three-layer structure guiding static electricity, and the second auxiliary grounding wire covers the common electrode wire and the grounding line.

* * * * *